United States Patent
Chen et al.

(10) Patent No.: US 6,794,706 B2
(45) Date of Patent: Sep. 21, 2004

(54) APPLICATIONS OF SPACE-CHARGE-LIMITED CONDUCTION INDUCED CURRENT INCREASE IN NITRIDE-OXIDE DIELECTRIC CAPACITORS: VOLTAGE REGULATOR FOR POWER SUPPLY SYSTEM AND OTHERS

(75) Inventors: Fen Chen, Williston, VT (US); Rajarao Jammy, Wappingers Falls, NY (US); Baozhen Li, South Burlington, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 10/064,493

(22) Filed: Jul. 22, 2002

(65) Prior Publication Data

US 2004/0012046 A1 Jan. 22, 2004

(51) Int. Cl.[7] .............................................. H01L 29/76
(52) U.S. Cl. ...................... 257/310; 257/301; 257/303; 438/243; 361/301.1
(58) Field of Search ................................ 257/310, 301, 257/303, 306, 532, 599; 438/243; 361/301.1, 303, 304, 305, 306.3, 311, 312, 313

(56) References Cited

U.S. PATENT DOCUMENTS

| | | | | |
|---|---|---|---|---|
| 4,901,133 A | * | 2/1990 | Curran et al. ................. | 357/54 |
| 5,330,935 A | * | 7/1994 | Dobuzinsky et al. ........ | 437/239 |
| 5,412,246 A | * | 5/1995 | Dobuzinsky et al. ........ | 257/632 |
| 6,348,394 B1 | * | 2/2002 | Mandelman et al. ........ | 438/424 |
| 6,479,862 B1 | * | 11/2002 | King et al. ................. | 257/321 |
| 2002/0039844 A1 | * | 4/2002 | Lee ........................... | 438/778 |

* cited by examiner

Primary Examiner—Nathan J. Flynn
Assistant Examiner—Fazil Erdem
(74) Attorney, Agent, or Firm—McGinn & Gibb, PLLC; Richard A. Henkler, Esq.

(57) ABSTRACT

A capacitor structure having a re-oxide layer on a nitride layer, wherein an interface between the nitride layer and the re-oxide layer includes electron traps. Characteristics of the carrier traps control a voltage output of the device. The thickness of the nitride layer and the re-oxide layer also control the voltage output. The nitride layer and a re-oxide layer form a dielectric capacitor. The dielectric capacitor undergoes a trap filled limit voltage, wherein a consistent voltage is output for a plurality of currents.

16 Claims, 7 Drawing Sheets

APPLICATIONS OF SPACE-CHARGE-LIMITED CONDUCTION INDUCED CURRENT INCREASE IN NITRIDE-OXIDE DIELECTRIC CAPACITORS: VOLTAGE REGULATOR FOR POWER SUPPLY SYSTEM AND OTHERS

BACKGROUND OF THE INVENTION

1. Field of the Invention

The present invention generally relates to the applications of space-charge-limited conduction (SCLC) induced current increase in nitride-oxide dielectric capacitors. One major application of the invention is with a voltage regulator and more particularly to a nitride-oxide dielectric capacitor voltage regulator. This invention is also applicable to other applications such as DRAM process controls (node dielectric thickness, defect, film uniformity, etc.), voltage sensors, space-charge-limited dielectric amplifiers, and SCLC memory devices.

2. Description of the Related Art

Voltage regulators are important components in power supply circuits and are used to maintain constant output voltage regardless of minor variations in load current or input voltage. For example, commonly used voltage regulators range from simple Zener regulators to relatively complicated voltage-regulating circuits. Tremendous amounts of waste power and relatively high temperature sensitivity make simple two-terminal Zener diode regulators impractical for on-chip power supply circuits.

Integrated voltage-regulating circuits can achieve much better power performance than Zener diodes; however, they employ many devices such as MOSFETs, capacitors, diodes, and resistors. Thus, they are structurally more complicated and physically consume larger die space than simple diodes or capacitor regulators. Although voltage regulators could be implemented off-chip or on-package to save die space, this implementation is not as effective and easy to use as on-chip very large scale integrated circuits (VLSIs).

The continued scaling down of DRAM cell sizes requires a thinner, higher quality, and more reliable storage node dielectric to compensate for decreased surface area and to reduce defect density. Recent trends have shown that the nitride-oxide stacked dielectric thin film becomes an attractive choice for the storage capacitor of large DRAM chips. However, the individual thickness of each layer (nitride and oxide) and the information about the traps inside this material system are hard to measure and control. Conventionally, a capacitance-voltage (C-V) method is used to obtain the electrical thickness and trap concentration for the device. However, C-V measurements can only measure the total thickness (the effective thickness) of the stack. C-V data analysis is difficult due to impacts from quantum-mechanical effects, gate leakage current, and series resistance effects caused by aggressive scaling of the dielectric thickness. Furthermore, the C-V method alone cannot determine the energy level of the traps. TEM is another method conventionally used to determine physical thickness of stacked structure. However, it is destructive, costly, localized, and tedious. It cannot be used for determining uniformity across the wafer or used as a routine in-line monitor.

BRIEF SUMMARY OF THE INVENTION

The invention provides a nitride-oxide stacked structure that produces an abrupt current increase at the voltage VTFL (trap filled limit voltage) prior to dielectric breakdown. Both planar and deep trench type devices could be fabricated by using this structure. Two things happen when the VTFL is reached, first, the capacitor current increases drastically. Secondly, the applied voltage across the capacitor remains relatively constant over a wide range of device current values. Numerous applications, such as voltage regulator, voltage sensor, DRAM/eDRAM process control, and SCLC memory device, find benefit with this inventive structure.

In order to attain the object(s) suggested above, there is provided, according to one aspect of the invention, a structure which has a nitride layer, a reoxidized nitride (re-oxide) layer on a nitride layer, and input and output connections. There are carrier traps inside the nitride layer and at the interface between the nitride and re-oxide layer. Characteristics of the carrier traps control a voltage output of the device. The thickness of the nitride layer and the re-oxide layer also control the voltage output. The nitride layer and a re-oxide layer form a dielectric capacitor. The dielectric capacitor undergoes a trap filled limit voltage, wherein a constant voltage is output for a plurality of currents. The trap filled limit voltage events can occur at different current levels, such that the invention produces a multi-value voltage regulator in one embodiment.

The power consumption of the invention's two-terminal N-O capacitor based voltage regulator is much less than Zener diodes based voltage regulator since it is operated below the dielectric breakdown voltage. The leakage current tunneling through amorphous N-O film is much less than the leakage current traveling through Si after breakdown of a Zener diode.

The present invention's N-O trench type voltage regulator has extremely high density (deep trench approach) design and is the best choice for space saving. On-chip voltage regulation with mass integration becomes possible by using the deep trench N-O capacitor as a inventive voltage regulator. This approach is also easily integrated and has low cost.

The invention is also useful with dynamic random access memory (DRAM) process control. Details of SCLC conduction parameters depend on the thickness and temperature. VTFL voltages are shown below to be proportional to the square of the film thickness. Since the re-oxide thickness is kept constant for all of the films, the variation of VTFL depends on nitride thickness only. There is no electrical method conventionally available to detect nitride thickness and re-oxide thickness separately for N-O stacked film. However, the invention provides such an electrical test methodology by combining VTFL I-V result and normal C-V result. The electrical thickness of the individual layer is thereby easily determined. Furthermore, nitride consumption rate during re-oxidation is also obtained with the invention. The activation energy extracted from temperature dependent SCLC current shows the characteristics of the traps. Therefore, the SCLC conduction parameters are easily monitored and are used to control the thickness and the level of defects during DRAM fabrication.

BRIEF DESCRIPTION OF THE SEVERAL VIEWS OF THE DRAWINGS

The foregoing and other objects, aspects and advantages will be better understood from the following detailed description of a preferred embodiment(s) of the invention with reference to the drawings, in which.

DETAILED DESCRIPTION OF THE INVENTION

DESCRIPTION OF PREFERRED EMBODIMENTS OF THE INVENTION

Figure 1:
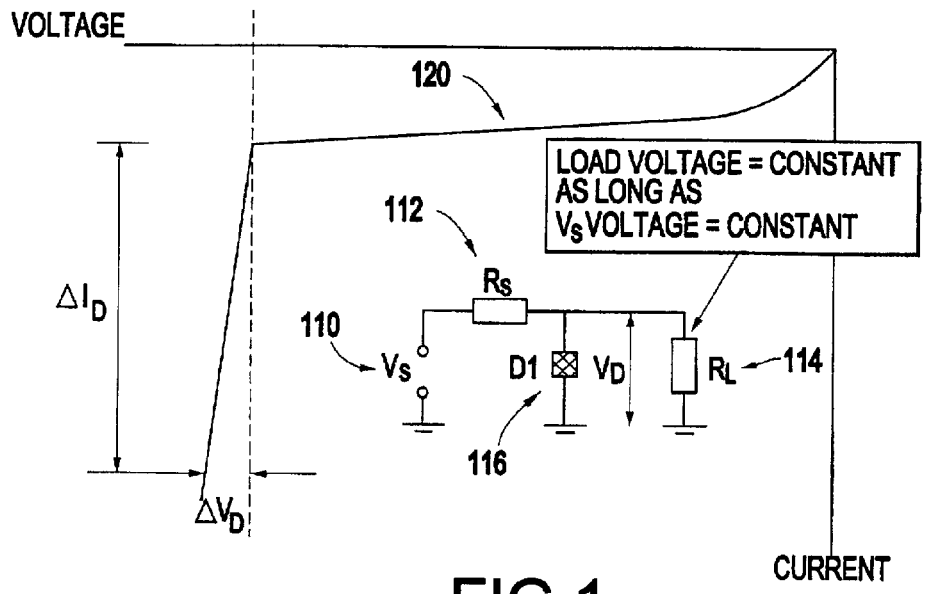
FIG. 1 illustrates a voltage regulator.

The invention presents a simple capacitor structure that has a number of very beneficial uses. The N-O capacitor structure described below is formed in a process that intentionally creates defects that this disclosure refers to as electron traps. The electron traps produce a number of benefits including outputting a constant voltage, allowing the this simple structure to be used as a voltage regulator/voltage sensor. In addition, the level of voltage that is output is directly dependent upon the square of the nitride film thickness. Therefore, the inventive structure can also be incorporated into capacitor structures, such as deep trench capacitors, planar capacitors, etc., to allow in-line monitoring of the nitride film thickness as the various capacitor structures are being manufactured. As described below, the inventive structure also includes a number of other useful purposes.

One excellent application for this simple structure is as a voltage regulator because the invention maintains a relative constant voltage despite minor variations in device current and temperature. More specifically, the invention comprises, in one form, a voltage regulator that is formed from a nitride-oxide dielectric capacitor. Another application for this newly-founded characteristic is for better process control of stacked dielectric capacitor fabrication. An important feature of the invention is that the nitride-oxide dielectric capacitor is selectively formed to have carrier "traps" that allow the voltage output by the inventive voltage regulator to be easily controlled. A detailed discussion of such traps occurs in "Abrupt Current Increase Due to Space-Charge-Limited Conduction In Thin Nitride-Oxide Stacked Dielectric System" by Fen Chen, B. Li, R. Jammy, and R. Dufresne, Journal of Applied Physics, v90, 1898 (2001), incorporated herein by reference.

Traps are formed due to certain amounts of structural disorders such as defects, dislocations, dangling bonds, impurities, and interface states inside the nitride film. Those electrically active traps can capture and store mobile electrons or holes and, thus, affect the carrier density. The traps will greatly reduce the current since initially empty traps will capture and thereby immobilize most of the injected electrons. As the injection level (applied voltage) is raised, all of the traps will eventually become filled and the current will rise sharply back to the trap-free value. Traps inside the nitride film are strongly dependent on the film deposition process and post-annealing. By changing deposition temperature, doping, annealing temperature, and ambient, etc., trap density and its energy level can be controlled and modified.

With the inventive device, there is an abrupt current increase at the voltage VTFL (trap filled limit voltage) before dielectric breakdown. Two things happen when the VTFL is reached. First, the capacitor current increases drastically. Secondly, the applied voltage across the capacitor remains relatively constant over a wide range of device current values. This allows the invention (in one form) to make an excellent voltage regulator because it maintains a relatively constant voltage despite minor variations in capacitor current.

FIG. 1 illustrates one structure in which the invention can be included. As would be known by one ordinarily skilled in the art, the inventive voltage regulator embodiment could be included in any location where a conventional voltage regulator would appear. In FIG. 1, item 110 represents the unfiltered voltage source that produces $V_S$. This voltage ($V_S$) can vary depending upon load, temperature, etc. The inventive voltage regulator is shown as a capacitor D1 (item 116) and regulates (filters) the voltage $V_S$ to a value $V_D$. Resistor 112 represents the resistance between the voltage source 110 and the inventive voltage regulator 116. Therefore, any devices (such as resistor 114) connected to the voltage source 110 and voltage regulator 116 would receive a constant voltage supply $V_D$. As is also shown in the voltage-current curve 120 overlaid on the circuit diagram in FIG. 1, over a broad current range, the voltage output by the voltage regulator remains relatively constant.

Figure 2:
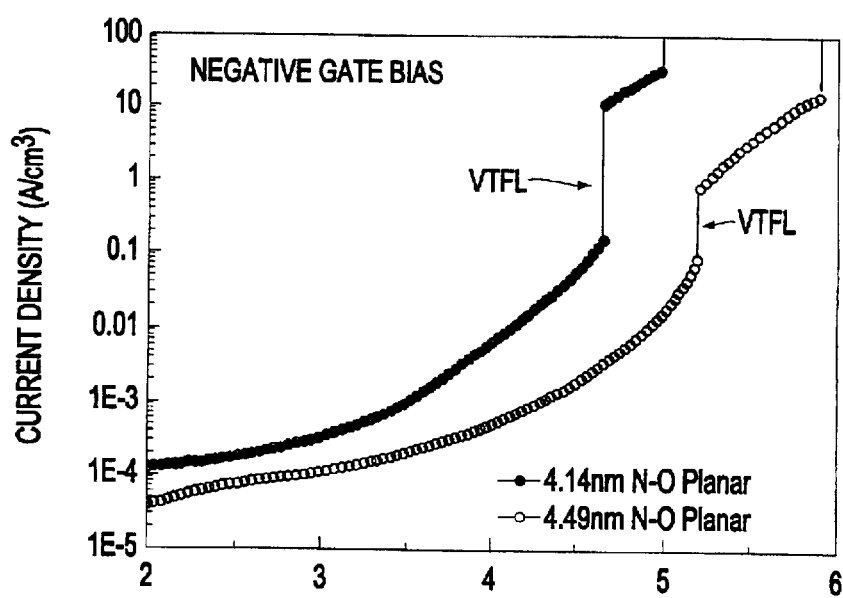
FIG. 2 illustrates two current/voltage curves for two different thicknesses of the inventive N-O dielectric capacitor.

As shown in FIG. 2, the inventive device produces an abrupt current increase under negative gate polarity. More specifically, FIG. 2 illustrates two current/voltage curves for two different thicknesses of the inventive N-O device (4.14 nm and 4.49 nm). Current rises nearly vertically at the voltage VTFL and the VTFL can easily be adjusted by altering the film thickness as shown in FIG. 2. The inventive device has the ability to reproduce the same, nearly vertical, rise at VTFL during repeated I-V (current voltage) ramps (cycles). The action of the inventive voltage regulator is not due to dielectric breakdown since leakage current is virtually unchanged during each successive I-V ramp. Light emission and C-V measurements further confirm that this sharp current increase is not due to dielectric breakdown.

Figure 3:
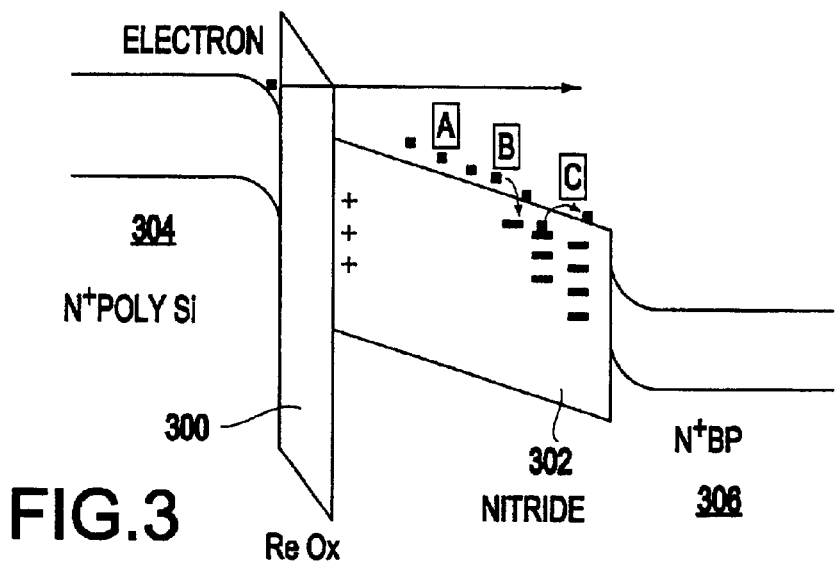
FIG. 3 illustrates the origin of the conduction mechanism in the inventive N-O films.

The properties of SCLC (space-charge-limited conduction) in the N-O insulator, having electron traps, indicates that most of the observations could be qualitatively accounted for. The origin of the conduction mechanism in the inventive N-O films is shown in the band diagrams of FIG. 3. For the negative gate bias, when the applied voltage is high, the injected electrons tunnel directly from the polysilicon 304, through the thin oxide layer 300 and enters the silicon nitride conduction band 302. This forms space-charges A, B, C that are similar to a vacuum diode.

In a perfect trap-free insulator, all of the injected carriers remain free and all contribute to the current. However, with the invention, carrier traps are generally formed in the nitride film or at the nitride-oxide interface as a result of a certain amount of structural disorders modulated by process. The presence of initial empty traps significantly reduces the current by capturing most of the injected carriers. As the injection level is raised, all of the traps will eventually become filled and the current will rise sharply back to the trap-free value. Therefore, in addition to controlling the voltage output level by altering the thickness of the N-O dielectric film, the invention can also control voltage output levels by changing the characteristics of the traps.

Figure 4:
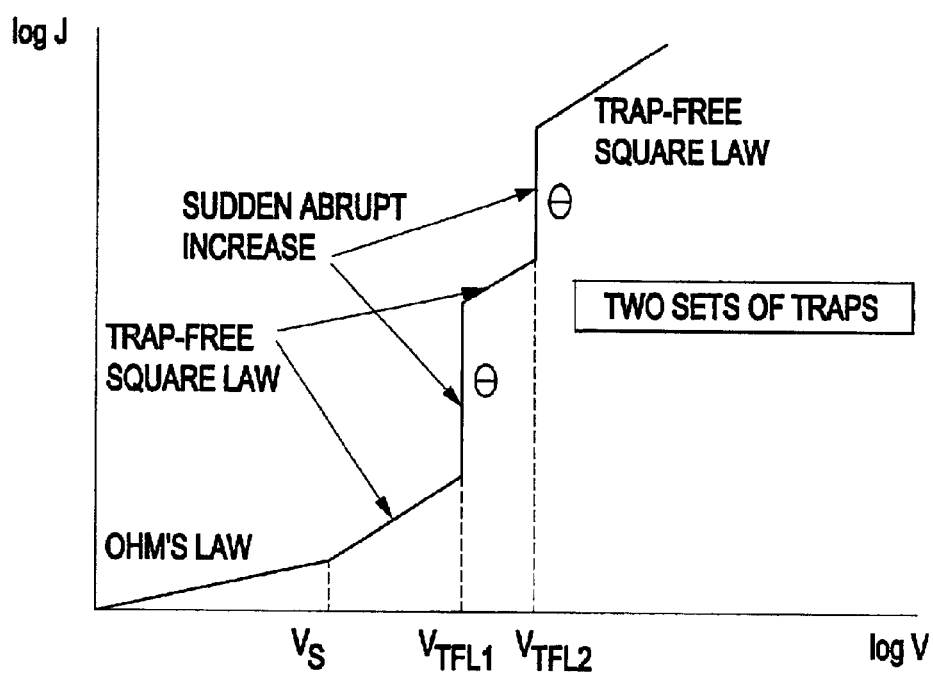
FIG. 4 illustrates the conduction parameters dependent on the trapping energy level, trapping density, nitride thickness and device temperature.

Details of SCLC conduction parameters depend on the trapping energy level, trapping density, nitride thickness, and device temperature. The trapping level and density could be modulated by different manufacturing processes. The invention can intentionally introduce more trapping levels into the nitride film to have multiple current jumps before device breakdown, as shown in the curve in FIG. 4. Therefore, the invention, in another embodiment, comprises a multi-value voltage regulator that is made of a single capacitor. In single-crystal material, a single level of traps usually form. However, in general, in amorphous or polycrystalline films, traps are formed at different energy levels, depending upon the nature of short-range order of geometry. The different environments for different traps possibly results in multiple discrete trap levels. By modulating the process parameters, multiple energy level traps can be formed. If two trap levels (one with high energy level and one with low energy level) co-exist inside the nitride film, they both will capture electrons initially to greatly reduce the current. As the applied voltage is raised, the lower energy level traps will first be filled and the current will rise to a certain high level, but not to the trap-free level. As the applied voltage is raised continuously, the high energy level traps will eventually also be filled and then the current will rise again to trap-free value. As a result, there will be two current sharp jumps for two different VTFL values.

Figure 5:
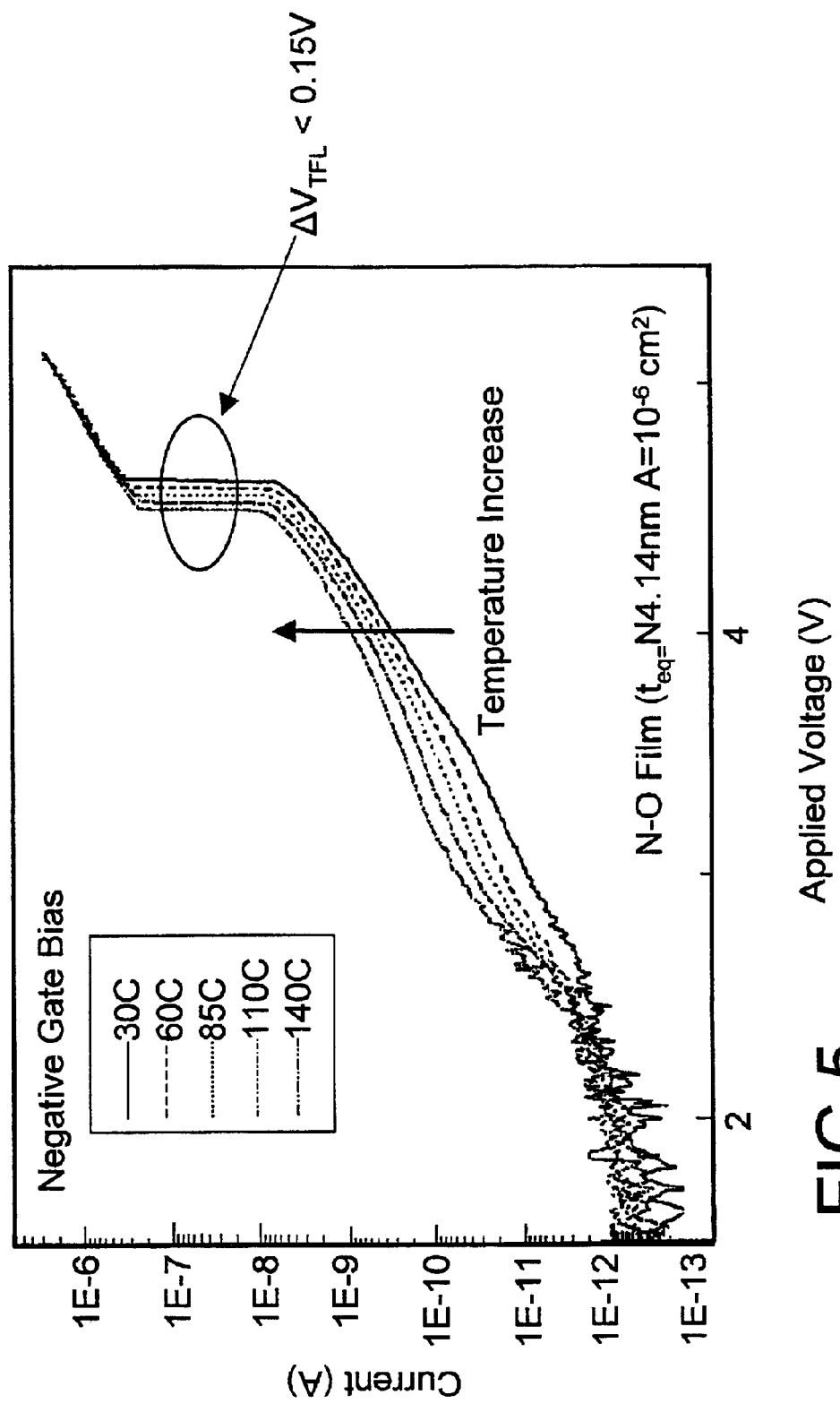
FIG. 5 illustrates the VTFL as relatively temperature insensitive as shown by the different temperature curves.

Furthermore, the VTFL is relatively temperature insensitive (dV<0.15V from 30° C. to 140° C.) as shown by the different temperature curves in FIG. 5. Therefore, the inventive structure is very stable under different temperature environments as opposed to a regular Zener diode which is temperature sensitive.

Figure 7:
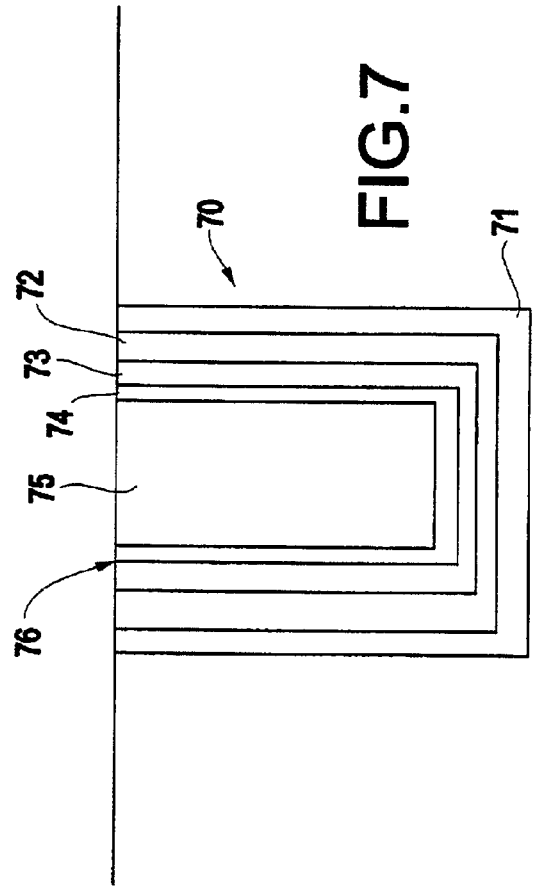
FIG. 7 is a schematic diagram of a DRAM device according to the invention.
Figure 6:
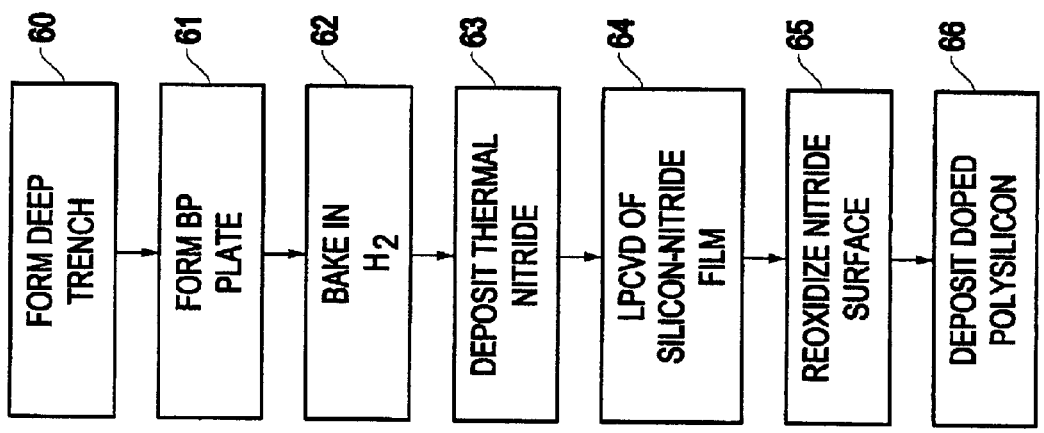
FIG. 6 is a flowchart showing the processing used to make the inventive voltage regulator.

In addition, both planar and deep trench capacitor N-O films can be fabricated with a standard MOS process. As shown in FIGS. 6 and 7, using well-known processes, the deep trench 70 is etched (step 60) and the n+ type buried plate 71 (bottom contact) is formed (step 61) by, for example, one of the following methods: gas phase doping, glass out-diffusion, and ion implantation utilizing an N-type dopant such as arsenic or phosphorus. Next, the sidewalls are precleaned using, for example a typical Huang A and B cleaning with a DHF step in between.

The following steps are performed insitu without break vacuum. First, in step 62 a H2 prebake is performed at 950° C. for 30 minutes or less to remove native oxide (this is optional). Then, in item 63 a NH3 bake process at 800° C. to 1000° C. is performed to grow a thin thermal nitride 72 as a nucleation layer (having a thickness of from about 20 to 25A) on the n+ buried plate. Next, in item 64 an LPCVD deposition of SiN 73 is made using, for example, dichlorosilance and NH3 as reactant gases to get the rest of the nitride thickness at 600° C.–750° C. The total nitride thickness is preferably in the range of 3–5 nm.

Figure 8:
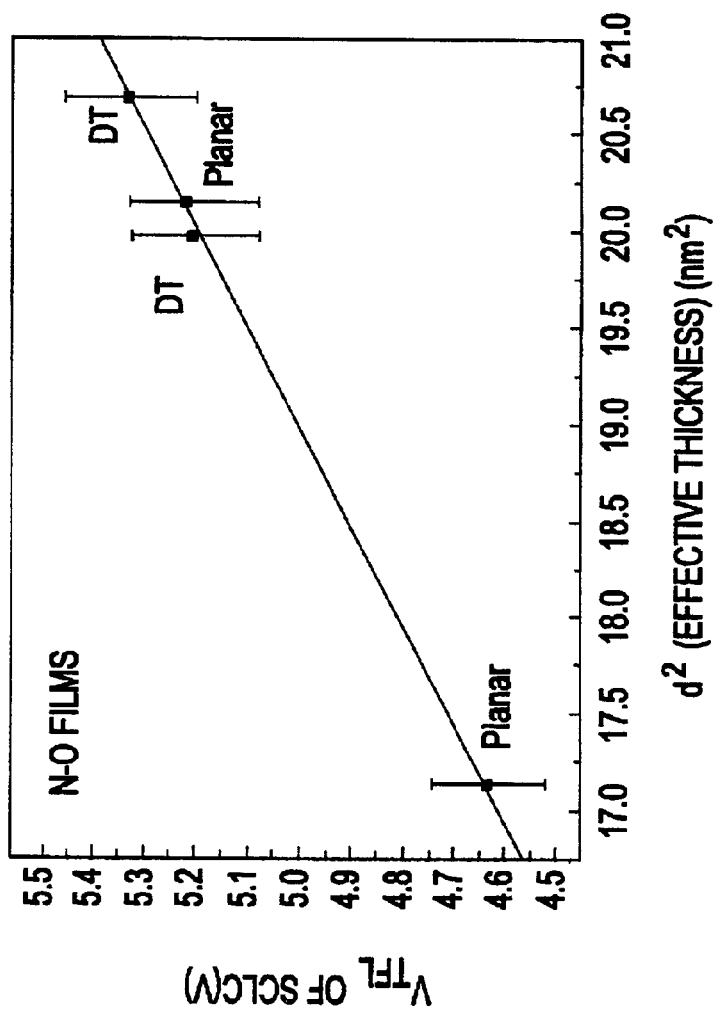
FIG. 8 is a chart showing the VTFL of a SCLC nitride-oxide capacitor that is proportional to the square of the film thickness.

Re-oxidation of the node nitride 73 is performed at about 900° C. to oxidize the top nitride to form a thin top oxide layer (so called re-oxide) 74 of a typical thickness from about 1 to about 2 nm (item 65). Next, a heavily n+ doped amorphous/poly-Si 75 is deposited into the deep trench to form a top contact (item 66). As discussed above, the VTFL of the nitride-oxide capacitor 73, 74 is proportional to the square of the nitride film thickness due to traps generated inside nitride layer. Therefore, by observing the VTFL of such a deep trench capacitor, the thickness of the nitride film may easily be determined. As shown in FIG. 8, the VTFL of such a SCLC nitride-oxide capacitor 73, 74 is proportional to the square of the film thickness.

Similarly, for the planar NO capacitor (not shown), the process starts by forming an n+ type buried plate on a Si substrate using well-known doping techniques such as gas phase doping, glass out-diffusion, ion implantation, etc., to form a contact. Prior to forming the nitride layer on the n+ Si buried plate, the Si substrate may be precleaned using a Huang-type precleaning process.

Again, the following steps are performed insitu without break vacuum. First, a H2 prebake is performed at 950° C. for 30 minutes or less to remove native oxide (this is optional). Then, a NH3 bake process at 800° C. to 1000° C. is performed to grow a thin thermal nitride as a nucleation layer (having a thickness of from about 20 to 25A) on the n+ buried plate. Next, an LPCVD deposition of SiN is made using, for example, dichlorosilance and NH3 as reactant gases to get the rest of the nitride thickness at approximately 600° C.–750° C.

Re-oxidation of the node nitride is performed at about 900° C. to oxidize the top nitride to form a thin top oxide layer of a typical thickness from about 1 to 2 nm. Then, a layer of n+ polysilicon is formed on the reoxidized nitride layer to form another contact. The n+ layer may be formed by deposition and ion implantation. The typical thickness is about 3000A.

Figure 9:
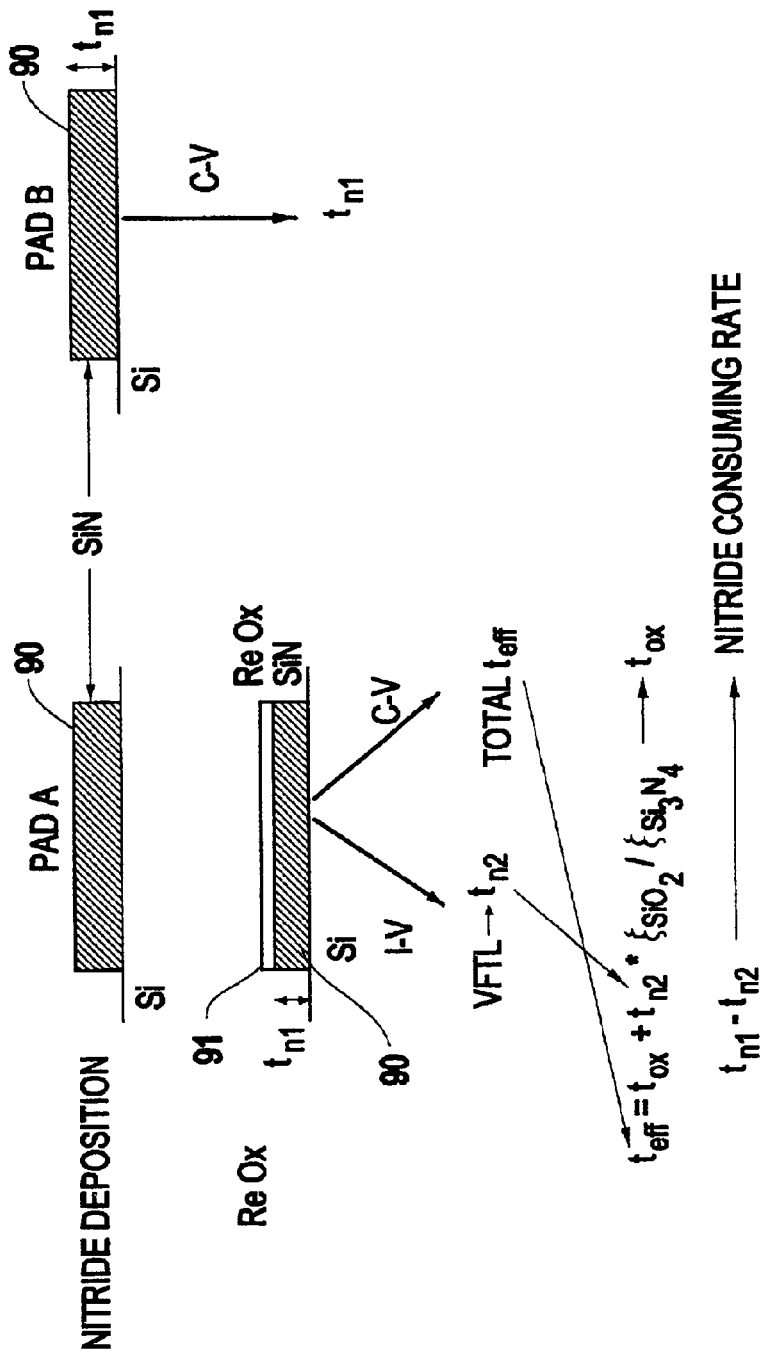
FIG. 9 illustrates a planar nitride deposition.

For example, FIG. 9 illustrates a planar nitride deposition 90 which, through a conventional CV process, produces a first thickness value $t_{n1}$. After the formation of the re-oxide 91, the VTFL of the structure indicates the thickness of the nitride film 90 after the re-oxidation process $t_{n2}$. In addition, the conventional CV process again provides a total thickness of both films (nitride and re-oxidation films) $t_{eff}$. The total thickness is equal to $t_{eff}=t_{ox}+t_{n2}*\varepsilon_{SiO2}/\varepsilon_{Si3N4}$. This process also allows the rate of nitride consumption to be determined by subtracting the second nitride thickness from the original nitride thickness.

Figure 10:
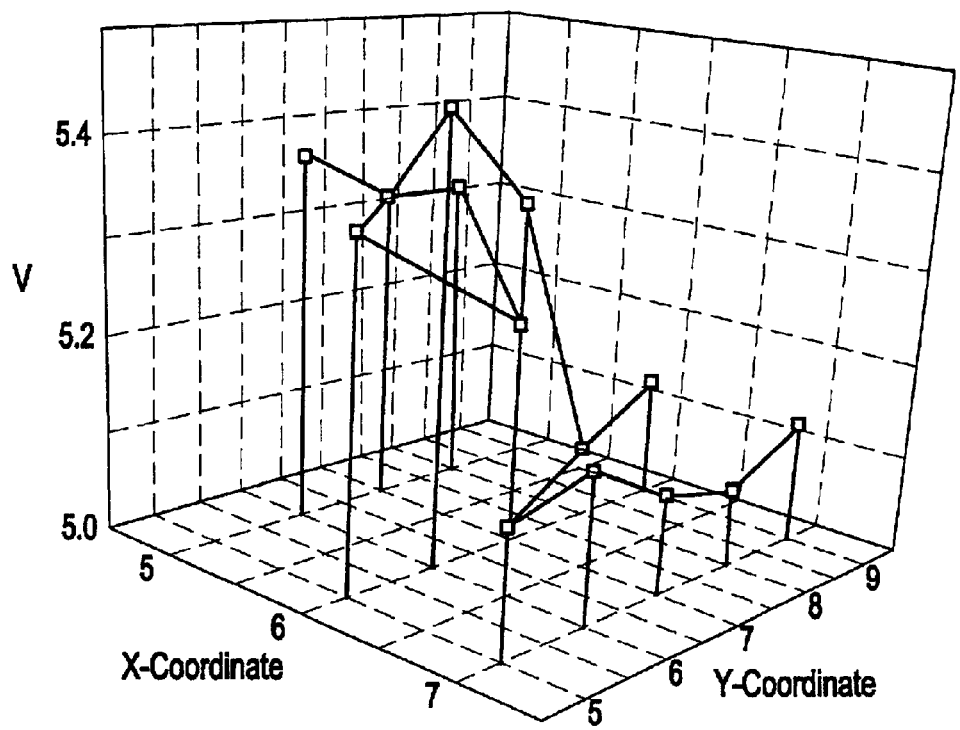
FIG. 10 is a chart illustrating VTFL I-V results.
Figure 11:
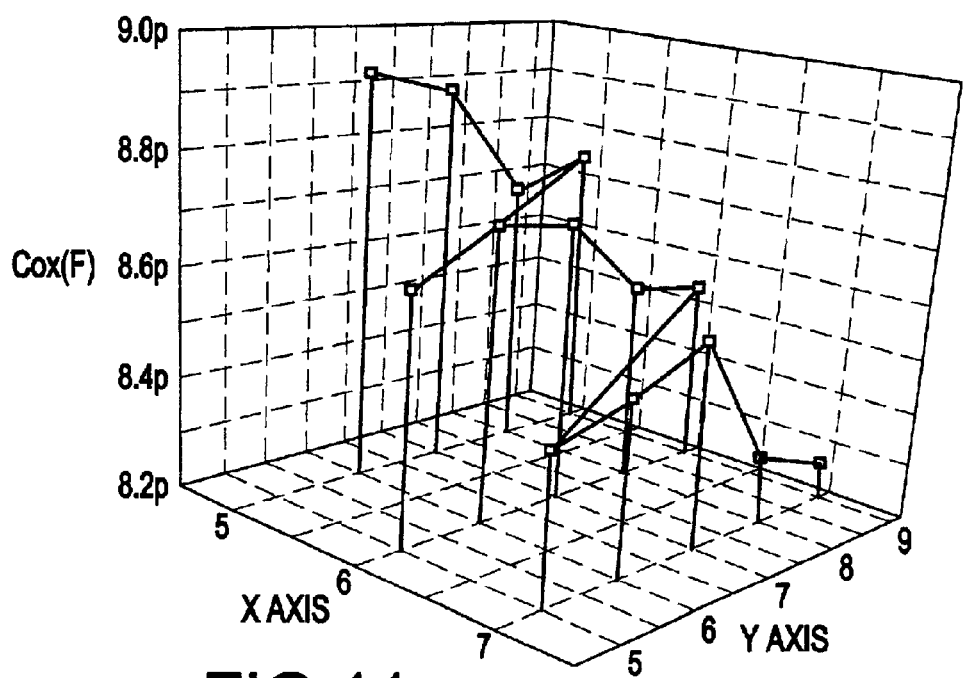
FIG. 11 is a chart illustrating C-V results.

By-checking the VTFL across the wafer, the uniformity (thickness and defect level) of the film (process) can be determined. Therefore, the invention presents another in-line monitoring function. As shown in FIG. 10, the VTFL I-V result is in excellent agreement with the C-V results (shown in FIG. 11). Specifically, the X and Y coordinates in FIGS. 10 and 11 are those of the structure itself. In FIG. 10, the Z coordinate represents the thickness as determined by the VTFL measurement, while the Z coordinate in FIG. 11 represents the thickness as determined by the conventional CV measurement. Thus, as shown, the invention produces results that are consistent with conventional in-line monitoring techniques. However, with the invention, the measurement process (I-V) is substantially simplified comparing with C-V and, therefore, is less expensive and less time consuming.

The foregoing manufacturing steps are only exemplary and the invention is not strictly limited to these processes. To the contrary, as would be known by one ordinarily skilled in the art, in view of this disclosure, there are a wide variety of processes that could be utilized to form the inventive structure. This invention is easily extended to other stack capacitor dielectrics and provides broad applications for both memory node and logic gate processes.

For process control and in-line monitoring application, by using the unique SCLC conduction properties, nitride thickness and the traps properties are easily identified, and, therefore, better process control is achieved. Details of SCLC conduction parameters depend on the thickness and temperature. Since the experiments to verify the invention intentionally keep the reox 300 thickness the same for all of the films, the VTFL depends on nitride 302 thickness only. To detect nitride thickness and reoxide thickness separately for N-O film, the invention combines VFTL I-V results and normal C-V results. Furthermore, the nitride consumption rate during reoxidation is also used to determine nitride and reoxide thickness. From the activation energy extracted from temperature dependent SCLC current (FIG. 2), it is known that the character and magnitude of space-charge-limit effect are determined largely by the presence of the single set of shallow traps. Therefore, from the displacement 2, the energetic location inside the nitride forbidden gap of those traps could be determined. As a summary, both the value of VTFL and current displacement at VTFL can be monitored and used to control the thickness and the level of defects in N-O insulator. Thus, the above SCLC I-V analysis gives a fast, easy, and direct way to control the N-O thin film fabrication.

The invention has many applications/uses. For a voltage sensor application, as current increase occurs only at a very narrow voltage region, a small voltage shift will dismiss a sharp current jump. Thus, with the inventive device, by monitoring dI/dV, the voltage shifts are accurately determined. For a SCLC memory device, as the current sharply increase at VTFL, two states—before and after current jump with low and high current levels are obvious. Therefore, those two current states can be used as binary on and off states for memory application.

For voltage regulation application, as mentioned above, either a simple Zener diode or complicated IC voltage regulator is conventionally used in power supply systems. The invention is advantageous over such structures because the inventive N-O dielectric device provides multi-value voltage regulation with a single device, has high thermal stability, provides a wider current range (about 10× wider than a normal Zener diode), has a smaller voltage swing (dV<0.0IV), achieves high device density (deep-trench approach), and is very simple and low-cost. In addition, the invention provides a combination Decap (filter for reduction of AC ripple voltage) and voltage regulator in a single device. Filters are used to reduce the variations in the rectifier output signal. In order to produce a constant DC output voltage, it is necessary to remove as much of the rectifier output variation as possible. The capacitor filter is the most basic filter type and the most commonly used. The decoupling capacitive filter is simply a capacitor (or capacitor arrays) connected in parallel with the load resistance. The filtering action is based on the charge/discharge action of the capacitor. Since the invention's NO voltage regulator is a capacitor, the charge/discharge action can be combined with the voltage regulation application. All of those features provided by NO capacitors are easily integrated and manufactured using current CMOS processes.

While the invention has been described in terms of preferred embodiments, those skilled in the art will recognize that the invention can be practiced with modification within the spirit and scope of the appended claims. For example, the invention is easily applied as a voltage sensor or SCLC memory device.

What is claimed is:

1. A two terminal device comprising:
   a nucleation layer;
   a nitride layer on said nucleation layer;
   a re-oxide layer on said nitride layer; and
   a conductor on said re-oxide layer;
   wherein said nitride layer includes electron traps.

2. The device in claim 1, wherein characteristics of said electron traps control a voltage output of said device.

3. The device in claim 1, wherein a thickness of said nitride layer and said re-oxide layer control a voltage output of said device.

4. The device in claim 1, wherein said nitride layer and said re-oxide layer comprise one of a voltage regulator, voltage sensor, and memory device.

5. The device in claim 1, wherein said capacitor undergoes a trap filled limit voltage, such that a constant voltage is output for a plurality of currents.

6. The device in claim 5, wherein trap filled limit voltage events occur at different voltage levels, such that said device comprises a multi value voltage regulator.

7. A capacitor voltage regulator device comprising:
   a nucleation layer;
   a nitride layer on said nucleation layer;
   a re-oxide layer on said nitride layer; and
   a conductor on said re-oxide layer;
   wherein said nitride layer includes electron traps, and
   wherein a thickness of said nitride layer controls a voltage output of said structure.

8. The device in claim 7, wherein a thickness said re-oxide layer controls a voltage output of said device.

9. The device in claim 7, wherein said capacitor undergoes a trap filled limit voltage, such that a constant voltage is output for a plurality of currents.

10. The device in claim 9, wherein trap filled limit voltage events occur at different voltage levels, such that said device comprises a multi value voltage regulator.

11. A method of manufacturing a capacitor structure, said method comprising:
   thermally growing a nucleation layer on a substrate;
   performing a low pressure chemical vapor deposition (LPCVD) of silicon nitride on said nucleation layer;
   re-oxidizing a top portion of said silicon nitride to form a re-oxide layer; and
   forming a conductor on said re-oxide layer,
   wherein said nitride layer includes electron traps.

12. The method in claim 11, wherein characteristics of said carrier traps control a voltage output of said device.

13. The method in claim 11, wherein a thickness of said nitride layer and said re-oxide layer modulate a voltage output of said device.

14. The method in claim 11, wherein said nitride layer and said re-oxide layer comprise one of a voltage regulator, voltage sensor, and memory device.

15. The method in claim 11, wherein said capacitor undergoes a trap filled limit voltage, such that a constant voltage is output for a plurality of currents.

16. The method in claim 15, wherein trap filled limit voltage events occur at different voltage levels, such that said capacitor device comprises a multi value voltage regulator.

* * * * *